United States Patent [19]

Miller et al.

[11] Patent Number: 5,989,074
[45] Date of Patent: Nov. 23, 1999

[54] WIRE PAIR DISCONNECT MODULE

[75] Inventors: Mitchell Eugene Miller; Carl Gene Reed, both of Clemmons, N.C.; Ronald Treche, Glendale, Ariz.

[73] Assignee: The Whitaker Corporation, Wilmington, Del.

[21] Appl. No.: 08/995,422

[22] Filed: Dec. 18, 1997

[51] Int. Cl.[6] .................................................. H01R 9/22
[52] U.S. Cl. ....................... 439/709; 439/553; 439/540.1; 439/922
[58] Field of Search .................................... 439/402, 403, 439/709–712, 715–719, 723, 724, 922, 553, 540.1, 541.5, 552, 569, 570, 571, 572, 76.1

[56] References Cited

U.S. PATENT DOCUMENTS

| Re. 35,030 | 8/1995 | Siemon et al. | 439/532 |
|---|---|---|---|
| 4,697,720 | 10/1987 | Hotchkiss et al. | 220/337 |
| 4,773,867 | 9/1988 | Keller et al. | 439/49 |
| 4,883,432 | 11/1989 | Reed | 439/553 |
| 4,909,757 | 3/1990 | Reed | 439/532 |
| 4,993,970 | 2/1991 | Littrell | 439/535 |
| 5,035,645 | 7/1991 | Siemon et al. | 439/532 |
| 5,173,064 | 12/1992 | Audeval | 439/709 |
| 5,178,554 | 1/1993 | Siemon et al. | 439/188 |
| 5,215,480 | 6/1993 | Lesslie et al. | 439/709 |
| 5,422,946 | 6/1995 | Delakowitz et al. | 379/327 |
| 5,430,717 | 7/1995 | Fowler et al. | 370/58.2 |
| 5,494,461 | 2/1996 | Bippus et al. | 439/709 |
| 5,514,005 | 5/1996 | Jaycox et al. | 439/417 |
| 5,647,763 | 7/1997 | Arnold et al. | 439/540.1 |

OTHER PUBLICATIONS

AMP Application Specification 114–6062, Rev. O, Aug. 01, 1996, Pivot Connectors.

*Primary Examiner*—Christopher A. Bennett
*Attorney, Agent, or Firm*—Robert J. Kapalka

[57] ABSTRACT

A disconnect module 10 includes printed circuit board subassemblies 12 mounted on a mounting member 70 for connecting shielded twisted pair cables 2A and 2B, and for disconnecting the cables for testing the integrity of the circuits. Each module 10 also includes a ground bus 74 on the mounting member 70 for connecting drain wires 6 in multiple cables 2A and 2B through traces on printed circuit board subassemblies 12 to a ground reference. Each printed circuit board subassembly 12 includes an input electrical connector 30 and an output electrical connector 40, each of which can connect corresponding wire pairs 4 in four single pair shielded or screened cables, such as T1 cables. The connectors 30, 40 are mounted on the front of a printed circuit board 14 for easy access, and each connector includes a pivoting stuffer 36, 46. Disconnectable shunting connectors 60, mounted between the input and output connectors, normally connect corresponding wires in the two cables 2A, 2B, but can be removed to provide test posts for each pair circuit. The mounting member 70 includes a mounting track 72 for supporting multiple printed circuit board assemblies 12 in a row, and the ground bus 74 on the mounting track 72 engages ground traces 26 on the bottom of the printed circuit board assemblies 12.

32 Claims, 5 Drawing Sheets

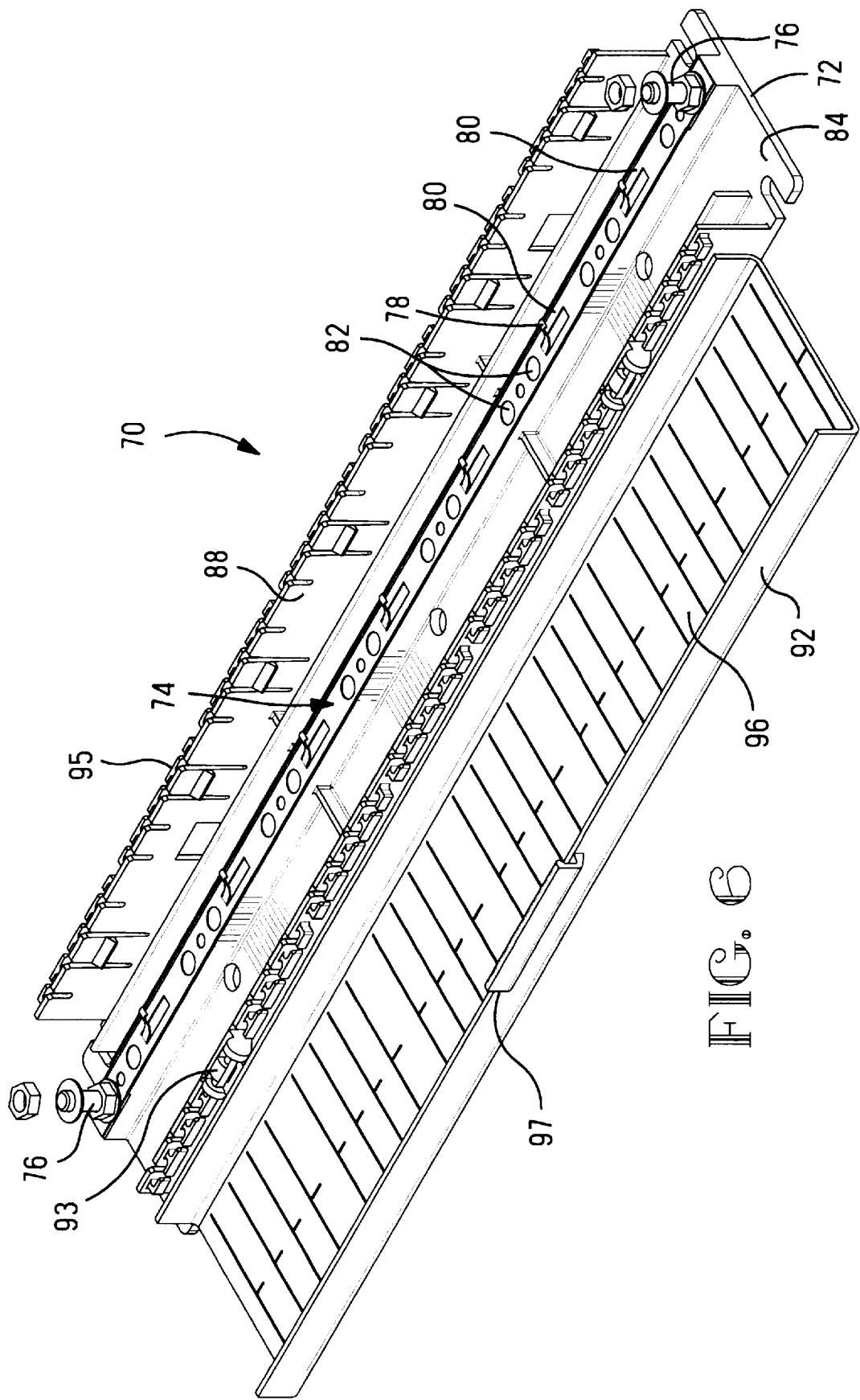

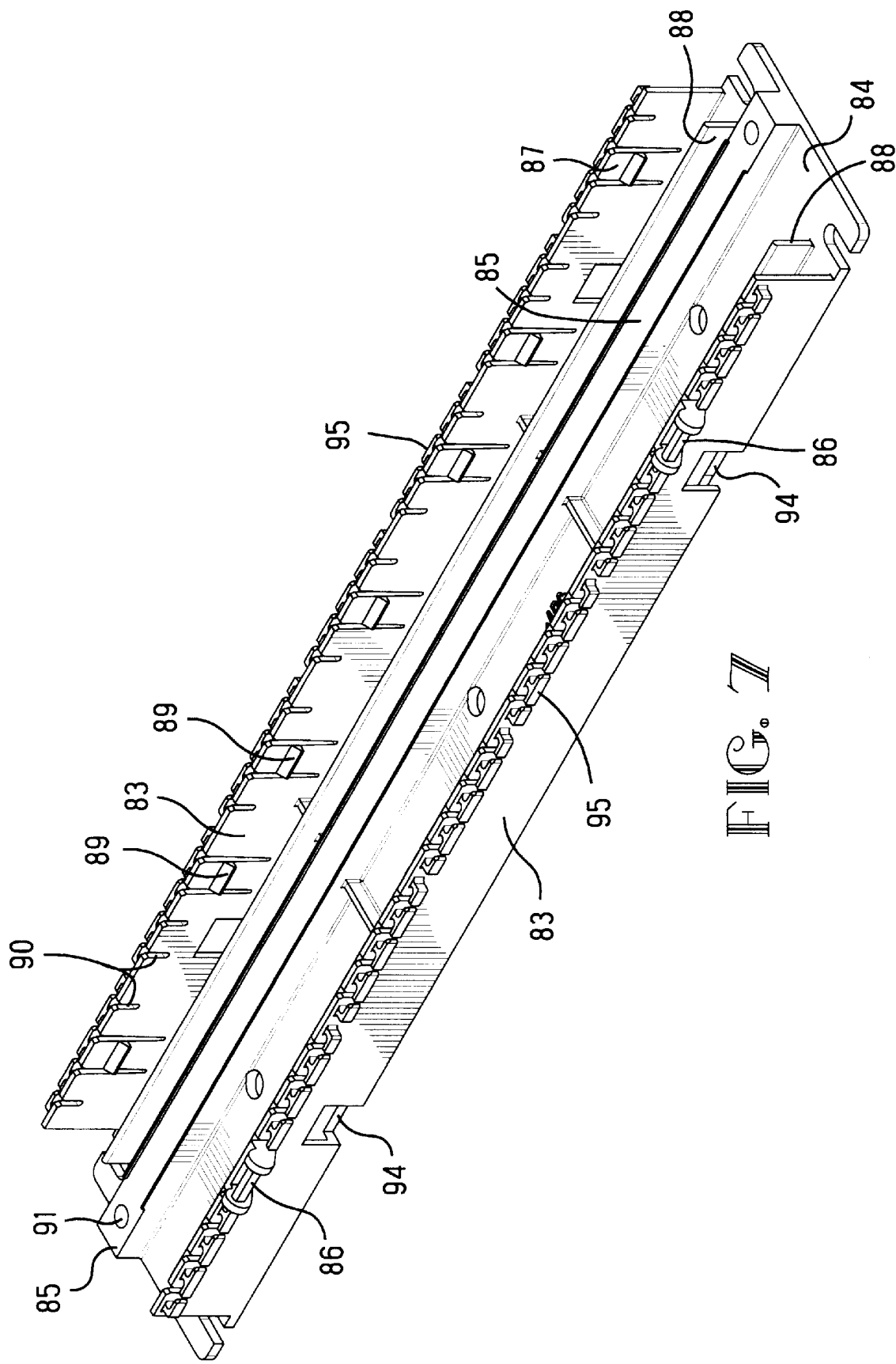

WIRE PAIR DISCONNECT MODULE

BACKGROUND OF THE INVENTION

1. Field of the Invention

This invention is related to electrical connector apparatus used to interconnect twisted pair wires and more particularly to the interconnection of shielded twisted pair cables. This invention is also related to modular assemblies for disconnecting one or more twisted wire pairs for rewiring, testing or other diagnostics. Furthermore, this invention is related to cross connect and disconnect apparatus that are used in wiring closets.

2. Description of the Prior Art

A common practice in wiring commercial buildings is to provide one or more wiring closets in which incoming twisted wire cables are connected to outgoing twisted pair cables. For example, incoming cables or risers can enter a wiring closet and there be connected to outgoing or horizontal cables that are attached to peripheral equipment that relies upon or must communicate with the service supplied by the incoming cable. Telecommunications wiring has long been deployed in buildings in this manner. As twisted pair wiring has been increasingly used in local area networks or other data networking or communications applications, the same equipment has been employed. However, conventional unshielded twisted pair cable may not be able to support all high speed communications applications. Category 5 cables offer one approach to improving the transmission rates for unshielded twisted pairs. Shielded twisted pair cable offers another means for supporting high data communications speeds. For example, T1 cables with data rates of from approximately 1.5 to 2.0 Mbit/s can operate satisfactorily at higher frequencies than unshielded twisted pair cables. However, conventional cross connect and disconnect equipment used for unshielded twisted pair cables do not provide a means for conveniently connecting the shields of all shielded or screened cables to a common reference potential or ground. The conventional practice is for the drain wires in all cables to be separately connected to a central ground or for the drain wires to be connected to jumpers which in turn lead to a ground reference point. Another approach is to use two standard 66 Blocks or cross connect blocks with a shielded twisted pair jumper wire connecting corresponding positions on the two blocks. The drain wires in this jumper are then connected to drain wires in incoming and out going cables and is then wired to ground. However, this approach is relatively labor intensive and the result is an unsystematic wire maze that is not easy to rewire.

SUMMARY OF THE INVENTION

A module including one or more printed circuit board subassemblies mounted in a row on a mounting track can be used as a disconnect member or as a cross connect for shielded or screened twisted pair cables, such as T1 cables. Each printed circuit board subassembly includes input and output electrical connectors for connection to input and output wire pairs in the shielded cables. Shunting connectors are located between the input and output electrical connectors. Normally, each shunting connector is positioned to common corresponding terminals in the two electrical connectors so that input and output tip and ring wires in each pair are interconnected. However, the shunting connectors for a selected pair can be easily removed to open the tip and ring circuits and provide test points for each. The integrity of the incoming circuit and outgoing circuit for each pair can be tested in this manner, and an installer can perform certain diagnostic procedures.

Each printed circuit board also includes a ground trace on the bottom surface to common grounding terminals to which the drain wires in the two cables are connected. This ground trace includes a ground contact pad that is engaged by resilient contacts or springs on a ground bus when the printed circuit board is mounted on the mounting track. The ground bus extends between opposite ends of the mounting track and includes multiple springs so that one ground bus can engage ground traces of multiple printed circuit boards mounted in a row on the mounting track. The ground bus is attached to ground studs on opposite ends for connection to an external ground reference or for connection to the ground bus of another module.

The preferred embodiment of this invention comprises a twenty eight pair disconnect module that can be used to connect T1 cables, and/or for use with Category 5 unshielded twisted pair cables. The preferred embodiment of this invention meets the transmission standards for Category 5. For the preferred embodiment it is possible to intermix shielded twisted pair and Category 5 in the same disconnect modules. Input shuelded twisted pair cables can be attached to one printed circuit board module on the mounting member and Category 5 cables can be attached to another module in the same row.

An important object of this invention is to provide a simple means for connecting all of the cables to ground by connecting the drain wires to a common ground buss provided in the same mounting track.

This disconnect module also provides a means for testing the integrity of both incoming and outgoing pairs by simply removing shunt connectors that are located on the printed circuit boards.

All of the cable connections in the module are made to electrical connectors or contacts mounted on the front of the printed circuit boards on the modules, and the printed circuit boards can be easily snapped into or removed from mounting tracks. Therefore, all components are accessible on the front of the modules to simplify installation and diagnostic procedures. All installation, testing or rewiring is either toolless or can be performed with simple tools, such as a screwdriver.

The input and output electrical connectors utilize individual pivoted suffers that terminate a pair of conductors when pressed down from the front. The suffers can also be pivoted to the open position by a screwdriver for rewiring. Shunting connectors, located between input and output connectors, can be removed and test receptacles inserted on posts on the front of the printed circuit board.

The modules employ a ground bus on a mounting track that can be attached either directly to a backboard or to a standard bracket, such as an 89B bracket commonly used in wiring closets. Ground connections are made to the ground bus by simply snapping the printed circuit boards into the mounting track. Ground studs on the ends of the modules can be connected directly to a ground reference or to an adjacent module.

Although the typical use of these modules is as a disconnect, normally attached to cables entering or exiting a wiring closet or other location where a large number of cables are to be interconnected, these modules can also be used to form simple cross connects.

BRIEF DESCRIPTION OF THE DRAWINGS

FIG. 6 is a view of a mounting member or track in which multiple printed circuit board subassemblies are mounted with a ground bus and studs located on the mounting member, and showing a hinged cover in the open position.

FIG. 7 is a view of a mounting track showing flexible latch members, conductor slots with retention feature, and bracket mounting slots.

DETAILED DESCRIPTION OF THE PREFERRED EMBODIMENT

Figure 1:
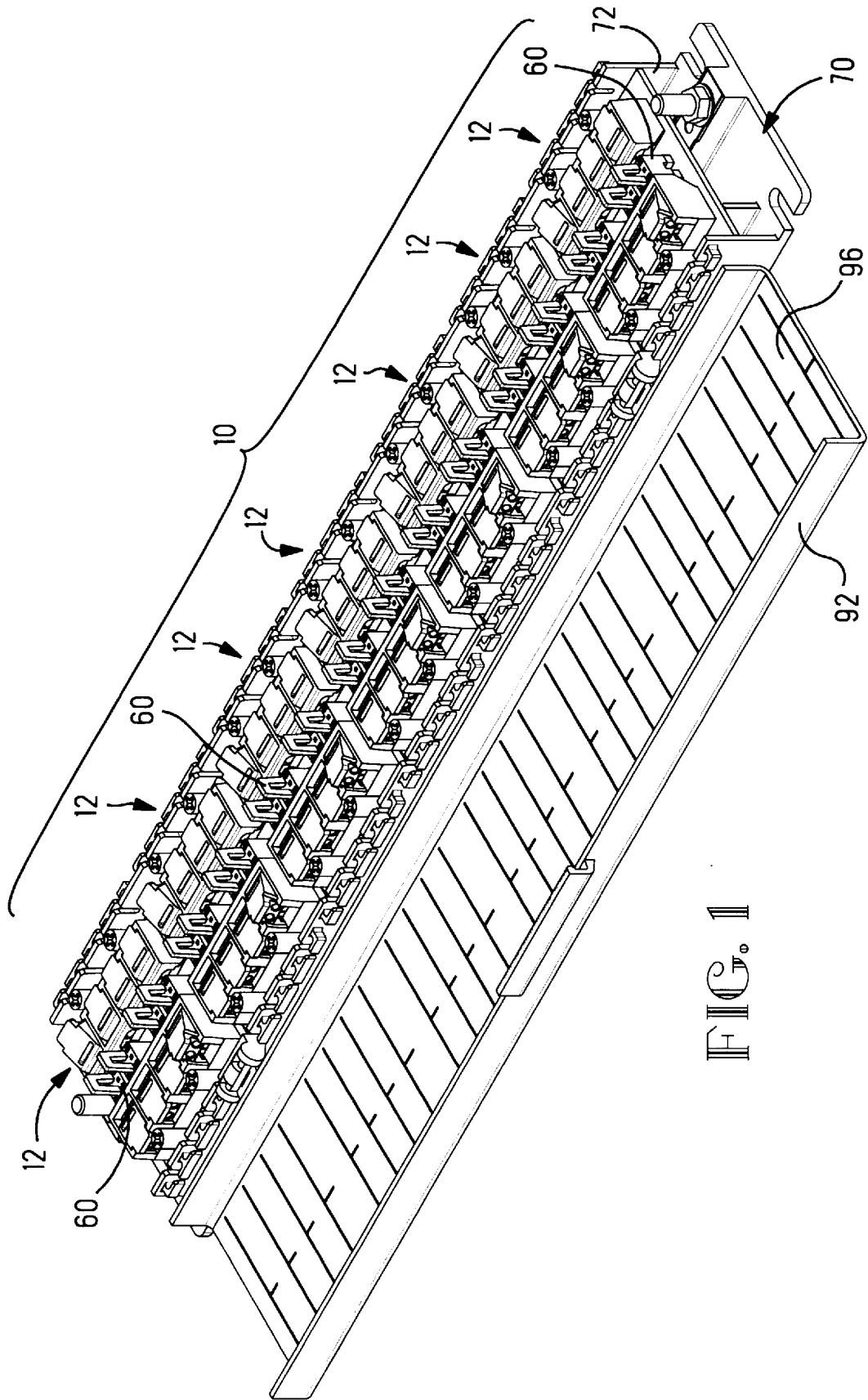
FIG. 1 is a view of a twenty eight pair disconnect module including seven printed circuit board modular subassemblies which each connect shielded or screened conductors to shielded or screened output conductors.

The primary use of the disconnect module 10 shown in FIG. 1 is to connect input shielded twisted pair cables 2A to output shielded twisted pair cables 2B in a location, such as a wiring closet, where input cables 2A providing communication to servers are to be connected to output cables 2B leading to dispersed clients such as electronic equipment including computers or telecommunications equipment. For example, the input cable 2A may be a riser and the output cable 2B could be a horizontal cable. The preferred embodiment of this disconnect module 10 can connect twenty eight input and output screened or shielded twisted wire pairs in one module. In the preferred embodiment, the screened or shielded twisted pair cables 2A and 2B are each T1 cables having data rates of from approximately 1.5 to 2.0 Mbit/s. Each cable 2A and 2B includes a twisted wire pair 4, a drain wire 6 and a screen or foil shield 8 which is maintained at a common potential or ground reference potential. Input and/or output cables could also be Category 5 unshielded twisted pair cables.

Disconnect module 10 employs modular printed circuit board subassemblies 12 that are mounted on a mounting member 70 further comprising a mounting track 72 and a cover 92. In the preferred embodiment, seven identical modular printed circuit board subassemblies 12 can be mounted in a row on a single mounting track 72 so that each module supports twenty eight wire pairs.

Figure 2:
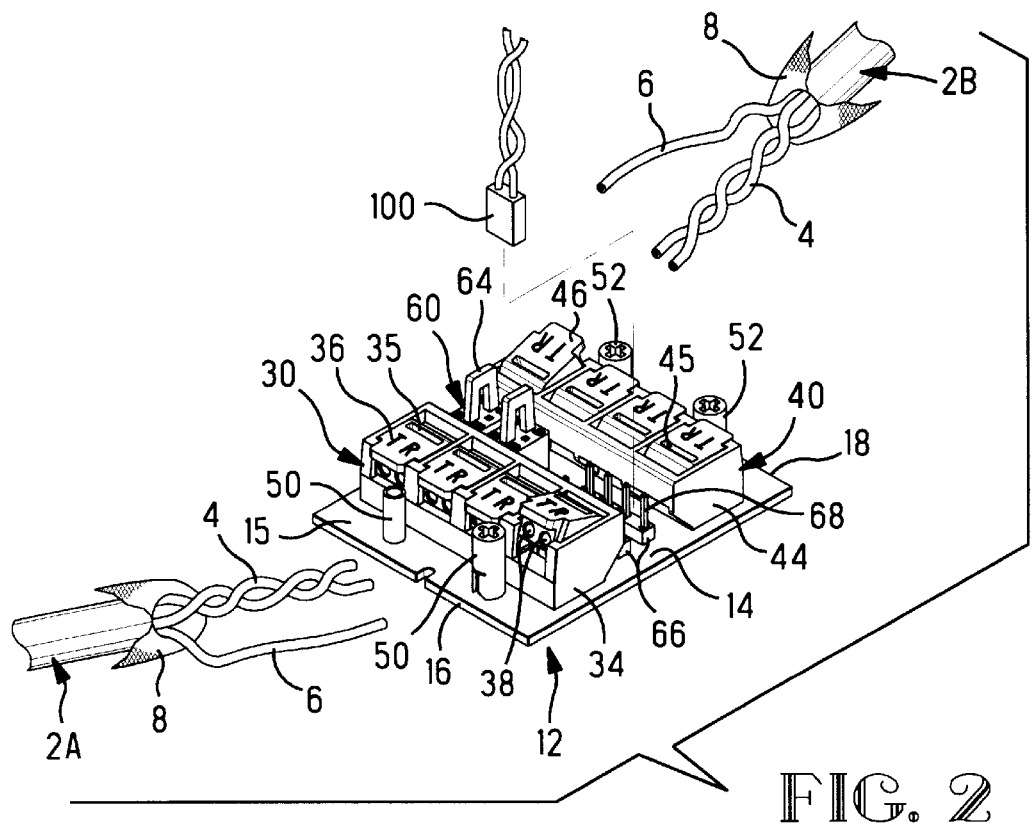
FIG. 2 is a view of a single printed circuit board subassembly for connecting two shielded or screened conductors.
Figure 3:
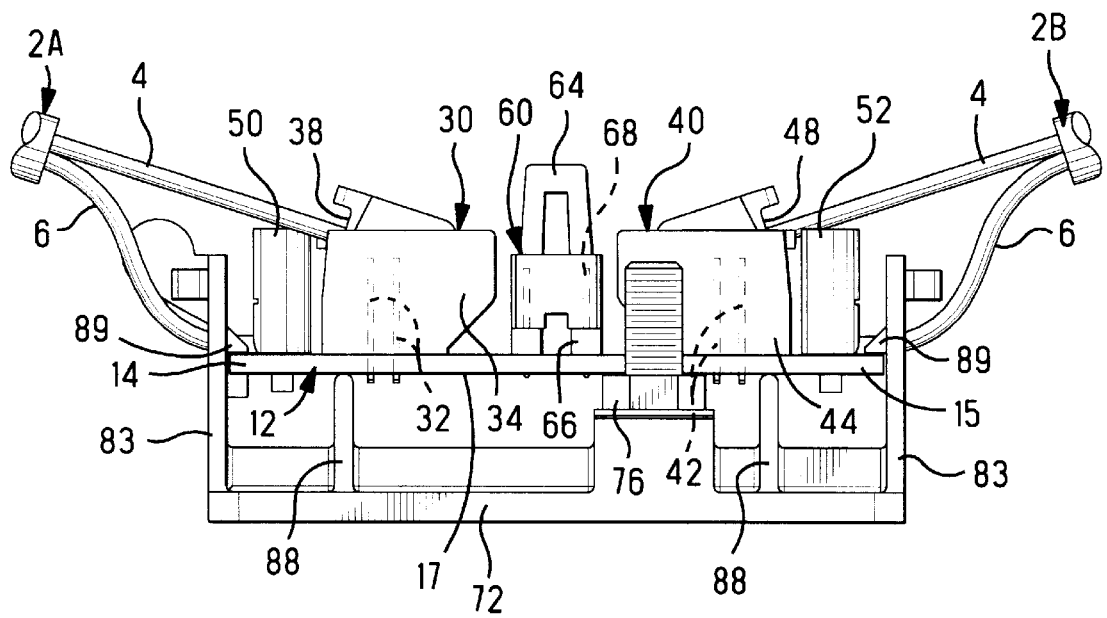
FIG. 3 is a side view of the printed circuit board subassembly shown in FIG. 2 showing the manner in which the printed circuit board subassembly is mounted on a mounting track and showing the manner in which signal conductors and drain wires are terminated.

Each of the modular printed circuit board subassemblies 12, shown in more detail in FIGS. 2 and 3, provides means for interconnecting four single pair screened input cables 2A to four single pair screened output cables 2B. Each subassembly 12 is intended for use with four twisted pair shielded or screened cables. Each modular printed circuit board subassembly 12 includes electrical connectors 30 and 40 for connecting corresponding tip and ring signal wires in each wire pair 4 in the input and output cables. The drain wires 6 can also be connected to the printed circuit board 14 by ground terminals 50, 52. On each printed circuit board subassembly 12, four disconnectable shunt connectors 60 are located between input electrical connector 30 and an output electrical connector 40.

Figure 4:
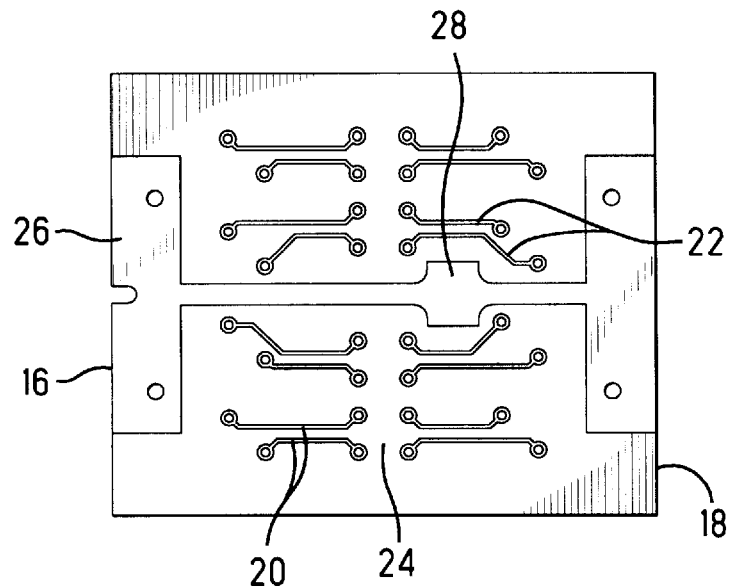
FIG. 4 is a view of the bottom or solder side of a printed circuit board showing the signal and ground traces on the printed circuit board used in the printed circuit board subassembly shown in FIG. 2.

The printed circuit board 14 on which each of these connecting means are mounted comprises a single sided printed circuit board having a front face 15 and a rear or solder side or face 17. The electrical connectors 30, 40, the ground terminals 50, 52 and the shunt connectors 60 are located on the front face 15 where they are accessible for cable installation and for testing. These electrical connection means are located between an input printed circuit board edge 16 and an opposite output printed circuit board edge 18. As shown in FIG. 4, input traces 20, output traces 22 and a ground trace 26 are located on the lower face 17 and provide interconnection for these electrical connection means. The input ground terminals 50 are located closest to the input edge 16 and the output ground terminals 52 are located closest to the output edge 18. As shown in FIG. 4, a single ground trace 26 connects all of the ground terminals 50 and 52 located on each printed circuit board 14. A single input connector 30 is located inboard of and adjacent to the input ground terminals 50 and a single output connector 40 is located inboard of and adjacent to the output ground terminals 52.

The shunt connectors 60 are connectable to posts 68 located in shunting post headers 66 located between the input connector 30 and the output connector 40. Each of these components comprises through hole components that have leads extending through holes in the printed circuit board 14 so that the leads can be soldered to traces on the bottom face or solder side 17 of the printed circuit board by conventional means. Individual input traces 20 extend from the location of the input connector 30 to an intermediate or central location where the shunting post headers 66 are mounted on the printed circuit board 14. An individual input trace 20 extends between each of the holes where an input contact 32 will be soldered to the trace and the location where a corresponding post 68 will be soldered to the printed circuit board. Correspondingly, an output trace 22 extends between each of the holes where an output contact 42 will be soldered to electrically connect with a corresponding post 68 on the output side of the printed circuit board 14. As shown in FIG. 4, the input traces 20 are not directly connected to corresponding output traces 22 in the center or intermediate section 24 of the printed circuit board 14. Input traces 20 are to be connected to corresponding output traces 22 only by a properly oriented shunt connector 60.

The input and output electrical connectors 30, 40 each comprise printed circuit board pivot connectors of the type manufactured by AMP Incorporated. The input and output connectors 30 and 40 are substantially the same with the exception that the color of the input connectors 30 differs from the color of the output connectors 40 so that an installer can more easily wire the modules 10. Each of these connectors includes eight insulation displacement contacts, located in four pairs in a housing base. The eight input contacts 32 in input connector 30 are more closely adjacent the input printed circuit board edge 16, as shown in FIG. 3. Similarly the eight output contacts 42 in output connector 40 are more closely adjacent to the output printed circuit board edge 18. Each connector also includes pivoting covers or wire stuffers for each of the four wire pairs. The pivoting cover or stuffer 36 on input connector 30 is mounted on the input connector housing base 34 and is pivoted about an inner end of the housing base 34. Similarly the pivoting cover or stuffer 46 on output connector 40 is also mounted on an output connector housing base 44 and is pivoted about an inner end of the housing base 44. As best shown in FIG.

2, each of the stuffers 36, 46 has two wire slots or holes 38, 48 that extend respectively inwardly from the outer end of the input connector 30 and the output connector 40. These wire slots or holes intersect offset contact slots, not shown, that provide clearance for the insulation displacement portions of corresponding contacts 32 or 42 to engage and terminate wires positioned in slots or holes 38, 48 when the respective stuffer 36, 46 is pressed downwardly into a closed position. A sealing gel can be deposited in the connector to moisture proof the contact interface, and the connectors provide a dead front connection. With the connectors oriented in the positions shown, incoming wires can be inserted into the input connector 30 from the direction of the input edge 16 and outgoing wires can be inserted into the output connector 40 from the direction of the output edge 18. With the pivoting stuffers 36, 46 in the open positions, shown by the foremost input and rearmost output connector as shown FIG. 2, the holes 38, 48 face upward at an angle so that wires can be easily inserted. As shown in FIG. 2, the legends T and R can be molded on the top of each stuffer to reduce confusion on the part of an installer. Since the input connectors 30 will always be positioned on the left of the printed circuit board 14 and the output connectors 40 will always be positioned on the right, and the tip and ring wires in each should be opposed, the T and R insignia are reversed on the two connectors.

The input connector 30 is separated from the output connector 40 by a central gap in which shunts are provided between the two connectors. As discussed with reference to FIG. 4, the input traces 20 do not directly join the output traces 22 in this intermediate location 24. Four shunting post headers 66 are located in this intermediate section 24. Each of these post headers 66 has four shunting posts 68 mounted in a molded body. Preferably, each of the posts 68 is an 0.025 square post of conventional construction that extends both above and below the molded body. The portions of the posts extending below the molded body extend through the holes at the ends of the input traces 20 or output traces 22 and are soldered to the corresponding traces by a conventional through hole solder process. Two post headers 66 are located end to end on opposite sides of the central ground trace 26 adjacent to the input electrical connector 30. Similarly two post headers 66 are located end to end on opposite sides of the same central ground trace 26 adjacent to the output electrical connector 40. The spacing between all of the posts 68 in the same row is not constant, because of the separation of the two post headers in each row necessary to clear the central ground trace 26. Also, the spacing between aligned posts 68 in the two adjacent post headers 66 on the same side of the central ground trace 26 is greater than the spacing between posts 68 in the same header. This greater spacing will prevent a disconnectable shunting connector 60 from shorting tip to ring by being improperly installed.

Figure 5:
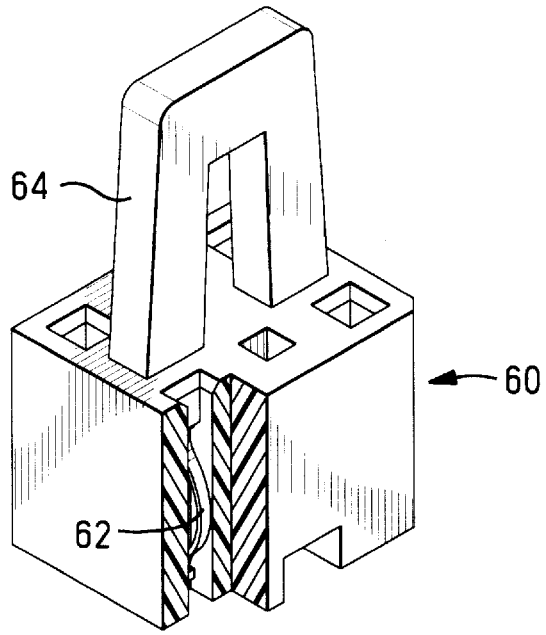
FIG. 5 is a view of a disconnectable shunt connector that is used in the modular printed circuit board subassembly.

The disconnectable shunting connector 60 is a two position shunting connector of the type manufactured by AMP Incorporated as Part Number 390102-1. With reference to FIG. 5, shunting connector 60 includes an upstanding handle 64 to simplify insertion and removal of the connector 60. This two position shunting connector contains four resilient shunting springs 62 that include a conventional receptacle contact section, not shown, that establishes a disconnectable contact with the posts 68 in the post header 66. Each of these shunting springs 62 establishes contact with one pair of posts 68. The two separate shunted pairs in each connector 60 are, however, not electrically connected. Therefore in a normal operating position two separate shunted pairs will be established between posts 68 joined to corresponding input traces 20 and output traces 22. Therefore tip conductors in corresponding input and output pairs will be electrically connected and ring conductors of the same corresponding input and output pairs will be electrically connected when the shunting connector is in this normal position.

The input and output electrical connectors 30 and 40 together with the shunting subassembly including post headers 66 and disconnectable shunting connectors 60 provide the means to connect input and output wire pairs 4. To connect a drain wire 6 in the input cable 2A to the printed circuit board 14 and to the ground trace 26, input ground contacts 50 are located between the input connector 30 and the input printed circuit board edge 16. Output ground contacts 52 located between the output connector 40 and the output edge 18 are used to connect a drain wire 6 in the output cable 2B to the ground trace 26. In the preferred embodiment of this invention cylindrical barrel terminals manufactured by AMP Incorporated are used as the ground input contacts 50 and 52. These ground contacts employ a cylindrical insulation displacement contact with an upwardly extending slot providing contact with drain wires inserted into the slot. A cylindrical stuffer cap is used to force the wire into the insulation displacement slot to permit toolless termination of either one or two drain wires 6 in each ground contact.

Each printed circuit board subassembly 12 employed in the preferred embodiment is intended to connect four incoming single pair cables to four outgoing single pair cables. However, in the preferred embodiment of this invention up to twenty eight pairs of connections can be made in one interconnection or disconnect module 10. To connect up to twenty eight pairs in one module 10, up to seven modular printed circuit board subassemblies 12 can be mounted on a mounting member 70 that includes a molded mounting track 72. The mounting member 70 also includes a ground bus 74, shown in FIG. 6, attached to the mounting track 72, for commoning the ground or drain wires 6 in all of the cables connected by the disconnect module 10.

FIG. 6 shows the mounting member 70 comprising the mounting track 72, the ground bus 74 and the mounting track cover 92. FIG. 7 shows details of the mounting track 72, which is molded from a conventional thermoplastic, such as ABS. Mounting track 72 has printed circuit board supports 88 that extend upwardly from a mounting track base 84. The printed circuit board latch members 87 are sufficiently flexible to permit printed circuit board subassemblies 12 to be snapped into place between the two spaced apart track walls 83. A series of hold down members 89 are located along the inner surfaces of the latch members 87 and opposing track walls 83. These hold down members 89 engage the input edge 16 and the output edge 18 of printed circuit board subassemblies 12 inserted side by side in a row between the two track walls 83. Support ribs 88, extending upward from the base 84 engage the bottom of the printed circuit boards 14, as shown in FIG. 3, so that each printed circuit board is held between support ribs 88 and hold down members 89. The mounting base 84 also has a raised channel 85 extending the entire length. This channel 85 positions the ground bus 74, and also includes holes 91 at opposite ends to secure the ground bus 74 in place with a grounding stud 76 at both ends of the mounting member 70.

The track walls 83 also have a series of wire dressing slots 90 along the upper edge and a series of T-shaped wire retention arms 95 extending from the outer sides of the track walls 83 to permit wires exiting the modular printed circuit board subassemblies 12 to be deployed longitudinally along the mounting track as the cables enter or exit the disconnect module 10. Mounting slots 94 located at the base of the track walls 83 provide a means for mounting the disconnect module 10 to a conventional standoff bracket, such as a conventional 89B bracket (not shown).

The cover 92 is mounted to the mounting track 72 by a two molded hinges 93 which engage hinge pins 86 located along the top edges of the track walls 83. The hinge pins 86 are designed to permit the cover 92 to be installed or removed when rotated to a prescribed angle, or rotated between a closed position and an open position shown in FIG. 6. Label 96 attached to the interior of the cover 92 provides spaces to identify the destination or function of each circuit for both the provider, or Telco, and the customer. A latch 97 molded onto the edge of the cover interacts with retention arms 95 on the track to hold the cover in the closed position.

Figure 8:
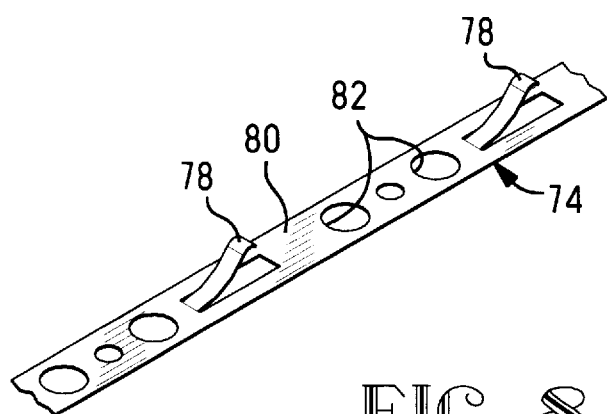
FIG. 8 is a view of the ground bus that is mounted on the mounting track base in which the resilient contacts or springs are shown extending upwardly from the plane of the stamped and formed ground bus.

The ground bus 74, shown in FIGS. 6 and 8, provides a means for connecting drain wires 6 in each cable to a common or ground potential. This ground bus 74 comprises a stamped and formed electrically conductive strip fabricated from a metal such as beryllium copper. Resilient ground contacts or springs 78 are formed upwardly from adjacent sections 80 of the ground bus 74. These springs 78 are spaced along the length of the ground bus 74 so that individual springs will be positioned to engage a ground contact pad 28 (FIG. 4) located on the ground trace 26 on the lower surface of each printed circuit board 14 of the printed circuit board assembly 12. Contact pads 28 are simply exposed sections on the ground trace 26. When the printed circuit boards 14 are snapped into the mounting track 72 and held in place by the hold down members 89, the resilient contacts or springs 78 are deflected downwardly so that the springs exert a sufficient force against the contact pads 28 to maintain a sufficient electrical connection so that all of the drain wires connected to the grounding trace 26 will be connected to a common reference potential or ground.

The ground bus 74 is stamped from a continuous strip and holes 82 are stamped along the length the strip. When the ground bus 74 is mounted in the mounting channel 85 at least one of these holes 82 will be aligned with a hole 91 in the molded mounting rail 85. A grounding stud 76 is then inserted through aligned holes 82 and 91 to both mount the grounding bus 74 on the mounting track 72 and to electrically connect the grounding bus 74 to a grounding stud 76 located at both ends of the mounting track 72. Wires can then be attached to the grounding studs to connect the grounding bus either directly to a ground reference point or to a ground bus in another disconnect module 10 and then to the ground reference point.

Individual disconnect modules 10 can be mounted in a wiring closet or similar location to connect incoming cables either directly to peripheral equipment served by the wiring closet or more typically to cross connect equipment located in the wiring closet. Disconnect modules can also be used between cross connect equipment and cables exiting a wiring closet to peripheral equipment. For larger installations, multiple disconnect modules 10 can be used at either the entry or exit of a wiring closet. When multiple disconnect modules are used in the same installation, the ground busses 74 in separate disconnect modules 10 can be connected in series by connecting wires between grounding studs 76 at the ends of the disconnect modules 10. Of course, ground busses 74 in multiple disconnect modules 10 can also be connected in a star configuration to a single ground reference point.

The disconnect modules 10 can be installed by attaching the mounting track 72 directly to a backboard. Alternatively, each of the disconnect modules 10 can be attached to a standard mounting bracket. For example, the mounting track can be snapped directly on a conventional 89B mounting bracket so that the disconnect modules stand off from the wall and so that cables can be extended through the conventional mounting bracket and behind the disconnect modules 10 mounted on the mounting bracket. Multiple modules 10 would typically be placed vertically end to end in either configuration with ground busses 74 connected in series. Individual printed circuit board subassemblies 12 can then be snapped into place on the mounting tracks 72. Only the minimum number of subassemblies required need be used. It is not necessary to use seven printed circuit board subassemblies 12 in each module 10, and those attached need not be adjacent to each other because a notch on the printed circuit board engages a rib on the mounting track to hold individual printed circuit board assemblies in place. In some situations, physical wiring considerations may dictate the use of multiple partially loaded modules 10 to allow for future expansion.

Drain wires 6 are first inserted into the ground terminals 50 and 52 adjacent to the outer edges of the printed circuit board 14. Since contact was established between the ground springs 78 and the ground trace contact pads 28 when the printed circuit board subassemblies were first snapped into position on the mounting track, the individual drain wires 6 are now connected to ground busses through the grounding terminals 50, 52, the single ground trace 26 on each printed circuit board 16 and the ground bus springs or resilient contacts 78. Next, the ends of individual wires in the input cable 2A are inserted into wire insertion holes 38 in open electrical connector pivoting stuffers 36. The stuffers 36 are then pressed into the closed position so that the insulation displacement or slotted plate input contacts 32 penetrate the wire insulation and engage the conductor to establish a gas tight electrical connection. The ends of output cable 2B can also be inserted in wire insertion holes of the stuffers 46 at this point and terminated to the output contacts 42. However, the input and output cables need not be connected at the same time. The installer then pulls the slack from drain wire 6 and both input and output pairs are pulled down through openings between retention arms 95 into the bottom of slots 90. The wire pairs 4 can be removed from the connectors 30, 40 by opening the stuffers 36, 46 and removing the wires for rewiring. A screwdriver slot 35, 45 is provided on the top of stuffers 36, 46 so that a screwdriver can be used to rotate the stuffers 36, 46 into an open position. Since these connectors 30, 40 are accessible from the front of the module 10, rewiring is relatively simple.

The disconnect module 10 also includes disconnectable shunting means that simplify diagnostics and testing. The shunting connectors 60 are shipped in the normal position in which tip and ring conductors to be attached to the input connector 30 will be connected to corresponding tip and ring conductors to be attached to the output connector 40. In other words, corresponding positions in the input connector 30 and output connector 40 are shunted when the shunting connectors 60 are in the normal position. Testing is accomplished by removing the shunting connector 60 from the shunting posts 68 of the conductor pair to be tested. A one pair test socket 100 can then be installed over the input or output tip and ring posts as required to test the circuit in either direction.

Although the preferred use of this invention is as a disconnect for shielded or screened twisted pair cables, the invention is not limited to this application. Since the wires can be easily removed from both the input and output electrical connectors, one module 10 with one or more printed circuit board subassemblies 12 can be used as a simple cross connect for a few cables. Alternatively two modules 10 could be used together as a cross connect. Jumpers could be used between the output connector of a first module and an input connector of a second module. The jumpers can then be rearranged to connect different input and output cables. In either this cross connect application or in the more typical disconnect application, it is not necessary that both the incoming cables and the outgoing cables be shielded. Indeed in many applications only the incoming cable will be shielded.

Although the electrical connectors 30, 40, the shunting connectors 60 and the grounding terminals 50, 52 employed in the preferred embodiment of this invention provide simple and convenient means for forming the various connections used in this disconnect module 10, the invention is not limited to these specific subcomponents. For example the input and output connectors could be replaced by more conventional insulation displacement clips that are commonly used to connect twisted pair wires in a wiring closet. Alternatively, other conventional electrical connectors, such as connectors having nonpivoting stuffers could be substituted for the pivoting electrical connectors used in the preferred embodiment. Similarly other shunting connectors or contacts could be substituted for the two position shunted connectors used in this invention, and contacts that are toolless or which require a tool could serve as substitute means for attaching the drain wires to the printed circuit board. Furthermore, in some applications the shunt would not be essential and in others the advantages of employing shunts in this manner could still be retained in an ungrounded module. Therefore the invention described herein is not limited to the representative preferred embodiment, but is defined by the following claims.

We claim:

1. An apparatus for connecting input cables to output cables, the apparatus comprising:
    a mounting member;
    a printed circuit board subassembly mounted on the mounting member, the subassembly including:
        a printed circuit board;
        input contacts on the printed circuit board for connecting wires in the input cables to the printed circuit board; and
        output contacts on the printed circuit board for connecting wires in the output cables to the printed circuit board;
    a ground bus on the mounting member; and
    a resilient contact connecting the ground bus to the printed circuit board.

2. The apparatus of claim 1 wherein the resilient contact is formed integrally with the ground bus.

3. The apparatus of claim 2 wherein the printed circuit board carries multiple ground terminals which are electrically connected to a common contact pad on the printed circuit board, and the common contact pad is engaged by the resilient contact.

4. The apparatus of claim 1 wherein multiple said printed circuit board subassemblies are mounted on the mounting member, and multiple said resilient contacts are formed integrally with the ground bus and are engaged with respective ones of the printed circuit boards.

5. The apparatus of claim 4 wherein the multiple printed circuit board subassemblies are arranged in a row with the input contacts being located along a first side of the mounting member and the output contacts being located along a second side of the mounting member.

6. The apparatus of claim 5 wherein each of the printed circuit boards carries multiple ground terminals which are electrically connected to a contact pad located between the input contacts and the output contacts of said each printed circuit board, and each of the resilient contacts on the ground bus engages a respective said contact pad.

7. The apparatus of claim 2 wherein the ground bus comprises a stamped and formed strip and the resilient contacts comprise sections of the strip which extend from a plane of the strip.

8. The apparatus of claim 3 wherein some of the ground terminals are located between the input contacts and a first edge of the printed circuit board, and others of the ground terminals are located between the output contacts and a second edge of the printed circuit board.

9. Apparatus for connecting input twisted pair wires to output twisted pair wires, the apparatus comprising:
    a printed circuit board;
    an input electrical connector on the printed circuit board, including input contacts for electrically connecting with each of the input twisted pair wires;
    an output electrical connector on the printed circuit board, including output contacts for electrically connecting with each of the output twisted pair wires;
    input traces on the printed circuit board extending from the input contacts to an intermediate location on the printed circuit board between the input electrical connector and the output electrical connector;
    output traces on the printed circuit board extending from the output contacts to the intermediate location on the printed circuit board; and
    a shunting connector which is connectable between the input traces and the output traces at the intermediate location to permit the input twisted pair wires to be connected to the output twisted pair wires, and the shunting connector being removable to permit testing of the input twisted pair wires.

10. The apparatus of claim 9 wherein terminals are mounted on the printed circuit board and each of the terminals is connected to a respective either one of the input traces or the output traces, and the shunting connector is matable with the terminals.

11. The apparatus of claim 10 wherein the terminals comprise posts and the shunting connector includes resilient contacts which are engagable with respective ones of the posts.

12. The apparatus of claim 11 wherein the posts are located in two rows between the input and the output electrical connectors.

13. The apparatus of claim 11 wherein the input and the output electrical connectors are located adjacent to respective opposite edges of the printed circuit board, and the posts are disposed between the input and the output electrical connectors.

14. The apparatus of claim 13 wherein each of the input and the output electrical connectors includes pivoting wire insertion members which have wire reception holes that are open toward a respective one of the edges.

15. The apparatus of claim 9 wherein at least one ground terminal is mounted on the printed circuit board.

16. The apparatus of claim 9 wherein the printed circuit board carries multiple ground terminals which are electrically connected to a contact pad located between the input electrical connector and the output electrical connector.

17. Apparatus for connecting input screened twisted pair cables each having a drain wire to output twisted pair cables, the apparatus comprising;
   a mounting member;
   a printed circuit board mounted on the mounting member, the printed circuit board having a front face, a rear face, and a contact pad on the rear face;
   input and output electrical connectors mounted on the front face of the printed circuit board;
   shunt connectors mounted between the input and the output electrical connectors on the front face of the printed circuit board;
   ground terminals on the front face of the printed circuit board for electrically connecting the drain wires in the input screened twisted pair cables to the contact pad on the printed circuit board; and
   a ground bus in engagement with the contact pad for connecting the ground terminals to a ground reference.

18. The apparatus of claim 17 wherein the ground bus is mounted between the printed circuit board and the mounting member.

19. The apparatus of claim 18 wherein the ground bus includes a resilient contact engaging the contact pad.

20. The apparatus of claim 17 wherein ground terminals are mounted on the front face of the printed circuit board for connecting drain wires in the output screened twisted pair cables to the printed circuit board.

21. The apparatus of claim 17 wherein the contact pad is centrally located on the rear face of the printed circuit board.

22. The apparatus of claim 17 wherein multiple said printed circuit boards are mounted in a row on the mounting member.

23. The apparatus of claim 22 wherein the ground bus is a one-piece member having multiple resilient contacts each engaging a respective said contact pad on one of the multiple printed circuit boards.

24. The apparatus of claim 17 wherein each of the input and the output electrical connectors includes wire insertion members, each said wire insertion member including holes for receiving wires of one said twisted pair cable, the wire insertion members being shiftable to bring the wires into engagement with contact terminals in one of the input and the output electrical connectors.

25. The apparatus of claim 24 wherein each of the wire insertion members is shiftable by pivoting.

26. The apparatus of claim 17 wherein each said shunt connector is mounted on terminal posts extending from the front face of the printed circuit board and located between the input and the output electrical connectors, and each said shunt connector is removable from the posts.

27. The apparatus of claim 17 wherein the mounting member includes a base and resilient supports extending from opposite sides of the base.

28. The apparatus of claim 27 wherein the ground bus is mounted on the mounting member base between the resilient supports.

29. The apparatus of claim 27 wherein the mounting member includes wire guide slots on the resilient supports.

30. The apparatus of claim 27 wherein the mounting member includes a cover pivoted about one side of the mounting member.

31. The apparatus of claim 17 wherein at least one grounding stud is mounted on the mounting member and electrically connected to the ground bus.

32. A disconnect assembly for connecting shielded input cables and unshielded input cables to respective output cables, comprising:
   multiple printed circuit board subassemblies, each said subassembly including an input electrical connector and an output electrical connector on a printed circuit board, some of said subassemblies being connectable to the shielded input cables and including an input ground terminal which is connected to a ground trace on the printed circuit board; and
   a mounting member on which the multiple printed circuit board subassemblies are mounted in a row, the mounting member including a ground bus extending along the row, the ground bus including resilient contacts each of which is engaged with a respective said ground trace;
   whereby the shielded input cables and the unshielded input cables can be connected to the output cables through the subassemblies located on a same said mounting member.

* * * * *